(12) United States Patent
Xu et al.

(10) Patent No.: US 11,721,717 B2
(45) Date of Patent: Aug. 8, 2023

(54) OPTICAL SYSTEM

(71) Applicant: HONG KONG BEIDA JADE BIRD DISPLAY LIMITED, Hong Kong (HK)

(72) Inventors: Quchao Xu, Hong Kong (HK); Qiming Li, Hong Kong (HK)

(73) Assignee: Jade Bird Display (Shanghai) Limited, Shanghai (CN)

( * ) Notice: Subject to any disclaimer, the term of this patent is extended or adjusted under 35 U.S.C. 154(b) by 410 days.

(21) Appl. No.: 17/007,472

(22) Filed: Aug. 31, 2020

(65) Prior Publication Data

US 2022/0068996 A1 Mar. 3, 2022

(51) Int. Cl.
*H01L 27/15* (2006.01)
*H01L 33/62* (2010.01)
*H01L 33/58* (2010.01)

(52) U.S. Cl.
CPC ............ *H01L 27/156* (2013.01); *H01L 33/58* (2013.01); *H01L 33/62* (2013.01)

(58) Field of Classification Search
CPC ....... H01L 27/156; H01L 33/58; H01L 33/62; H01L 25/0753; G09F 9/33; G09F 9/302
See application file for complete search history.

(56) References Cited

U.S. PATENT DOCUMENTS

| | | | | |
|---|---|---|---|---|
| 2006/0250579 | A1* | 11/2006 | Silverstein | H04N 9/315 348/E9.027 |
| 2007/0002578 | A1* | 1/2007 | Furusawa | G02B 6/3594 362/551 |
| 2007/0132953 | A1* | 6/2007 | Silverstein | H04N 13/363 348/E13.058 |
| 2009/0189845 | A1* | 7/2009 | Toyooka | G09G 3/3406 345/102 |
| 2013/0242555 | A1* | 9/2013 | Mukawa | G02B 27/0172 362/237 |
| 2018/0307129 | A1* | 10/2018 | Shin | G03B 21/204 |
| 2019/0386073 | A1* | 12/2019 | Yang | G02B 27/1006 |
| 2021/0176440 | A1* | 6/2021 | St. Hilaire | G03B 21/2066 |
| 2021/0286178 | A1* | 9/2021 | Gollier | G02B 27/0093 |
| 2021/0294119 | A1* | 9/2021 | Osmanis | G02B 30/60 |
| 2022/0091427 | A1* | 3/2022 | Edwin | A63F 13/23 |
| 2022/0171190 | A1* | 6/2022 | Trisnadi | H04N 13/337 |

* cited by examiner

*Primary Examiner* — Victor A Mandala
(74) *Attorney, Agent, or Firm* — Rosenberg, Klein & Lee

(57) ABSTRACT

The present invention discloses an optical system including a light combination unit, a first LED panel and a second LED panel. The first LED panel is located at one side of the light combination unit and configured to emit a first light. The second LED panel is located at another side of the light combination unit and configured to emit a second light. The first LED panel is a monochrome LED panel, and the second LED panel is a double color LED panel. The first LED panel and the second LED panel respectively emit the first light and the second light into the light combination unit, and the light combination unit combines and collimates the first light and the second light along one direction.

19 Claims, 5 Drawing Sheets

OPTICAL SYSTEM

BACKGROUND OF THE INVENTION

1. Field of the Invention

The present invention relates to an optical system, and more particularly, to an optical system with a double color LED panel for increasing the light emitting efficiency and saving costs.

2. Description of the Prior Art

Optical systems for presenting information and displaying images are applied to various fields, such as screens, projectors, televisions, and so on. The optical system can be applied to flat panel display for computers, television, and portable DVD players. Mobile phones, digital cameras, personal assistants, and electronic games are other examples of hand-held devices that include displays. Moreover, heads-up displays on which the information is projected, for example, a windshield of an automobile or in a cockpit of an aircraft, will be more and more popular.

In general, the optical system includes three single color light sources (red, blue and green) and a beam splitter component. The three single color light sources are configured at different sides of the beam splitter component respectively and emit light to the beam splitter component respectively. Then, the beam splitter component combines the three lights to form images. Because of the trend of miniaturization of electronic products, the Micro LED display panel has been developed. However, the configuration of the three color light sources at the three sides of the beam splitter element increases the volume of the optical system.

Moreover, the traditional beam splitter component is formed by four triangular prisms, and it combines the lights according to the light splitting coating formed between each two of triangular prisms. However, the gaps occur between the triangular prisms when the triangular prisms are assembled to form the beam splitter component, thereby reducing the efficiency of light consolidation and increase the cost.

Thus, it is necessary to develop a new optical system to solve the problems of the prior art.

SUMMARY OF THE INVENTION

Therefore, the present invention is to provide an optical system including a light combination unit, a first LED panel and a second LED panel. The first LED panel is located at one side of the light combination unit and configured to emit a first light. The second LED panel is located at another side of the light combination unit and configured to emit a second light. The first LED panel is a monochrome LED panel, and the second LED panel is a double color LED panel. The first LED panel and the second LED panel respectively emit the first light and the second light into the light combination unit, and the light combination unit combines and collimates the first light and the second light along one direction.

Wherein, the light combination unit has a cuboid structure. The first panel is located at a first side of the cuboid structure and the second LED panel is located at a second side of the cuboid structure. The first side is vertical to the second side.

Furthermore, the light combination unit includes a first triangular prism and a second triangular prism. The first triangular prism is assembled with the second triangular prism to form the cuboid structure.

Wherein, the first LED panel is located at one side of the first triangular prism, and the second LED panel is located at one side of the second triangular prism.

Wherein, the light combination unit includes a light filtering layer located between the first triangular prism and the second triangular prism. The light combination unit selectively passes and reflects the first light and the second light according to the light filtering layer.

Wherein, the area of the first side of the cuboid structure is larger than that of the first LED panel. The area of the second side of the cuboid structure is larger than that of the second LED panel.

Wherein, the length of the first side of the cuboid structure is greater than that of the first LED panel. The length of the second side of the cuboid structure is greater than that of the second LED panel.

Wherein, the lengths of the first side and the second side are less than 10 mm.

Wherein, the color of the second light emit from the second LED panel is selected from two of blue, green, red, orange, yellow, cyan and purple lights.

Wherein, the first LED panel includes a plurality of first LED pixels and the second LED panel includes a plurality of second LED pixels. Each of second LED pixels selectively emits the second light with a first color light and a second color light.

Furthermore, the first LED pixels are arranged in a first array, and the second LED pixels are arranged in a second array.

Wherein, the second LED panel includes a plurality of second LED pixels. Each of the second LED pixels includes a substrate, a first bonding layer, a first color LED layer, a second bonding layer, and a second color LED layer. The first bonding layer disposed on the substrate. The first color LED layer disposed on the first bonding layer and emitting a first color light. The second bonding layer disposed on the first color LED layer. The second color LED layer disposed on the second bonding layer and emitting a second color light.

Wherein, each of the second pixels includes an insulation layer. The insulation layer covers the side wall of the first bonding layer, the first color LED layer, the second bonding layer, the second color LED layer, and the surface of the substrate.

Wherein, each of the second pixels includes a top conductive layer configured on the insulation layer and electrically connected to the second color LED layer.

In one embodiment, the first bonding layer and the second bonding layer are metal layers.

Furthermore, each of the second pixels includes a first anode pad and a second anode pad configured on the substrate. The first anode pad is electrically connected to the first bonding layer, and the second anode pad electrically connected to the second bonding layer.

In one embodiment, the second bonding layer is transparent, and the second bonding layer is a non-metallic layer.

Wherein, each of the second pixels includes a first connecting structure and a second connecting structure. The first connecting structure is configured between the first color LED layer and the second bonding layer, and the second connecting structure is configured between the second bonding layer and the second color LED layer.

Furthermore, each of the second pixels includes a first anode pad, a second anode pad and a cathode pad configured on the substrate. The first anode pad electrically connected to the first bonding layer, the second anode pad electrically connected to the second connecting structure, and the cathode pad electrically connected to the first connecting structure.

In summary, the second LED panel of the optical system can emit two colors, thus the optical system of the present invention only needs two LED panel to combine the lights to form the images, thereby reducing the volume and costs. In addition, the light combination unit of the optical system includes only two triangular prisms, so that the combined light is less affected by the gap between the two triangular prisms, thereby improving the light combining effect and reducing costs.

BRIEF DESCRIPTION OF THE APPENDED DRAWINGS

DETAILED DESCRIPTION OF THE INVENTION

A detailed description of the hereinafter described embodiments of the disclosed apparatus and method are presented herein by way of exemplification and not limitation with reference to the Figures. Although certain embodiments are shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of embodiments of the present invention.

Figure 1:
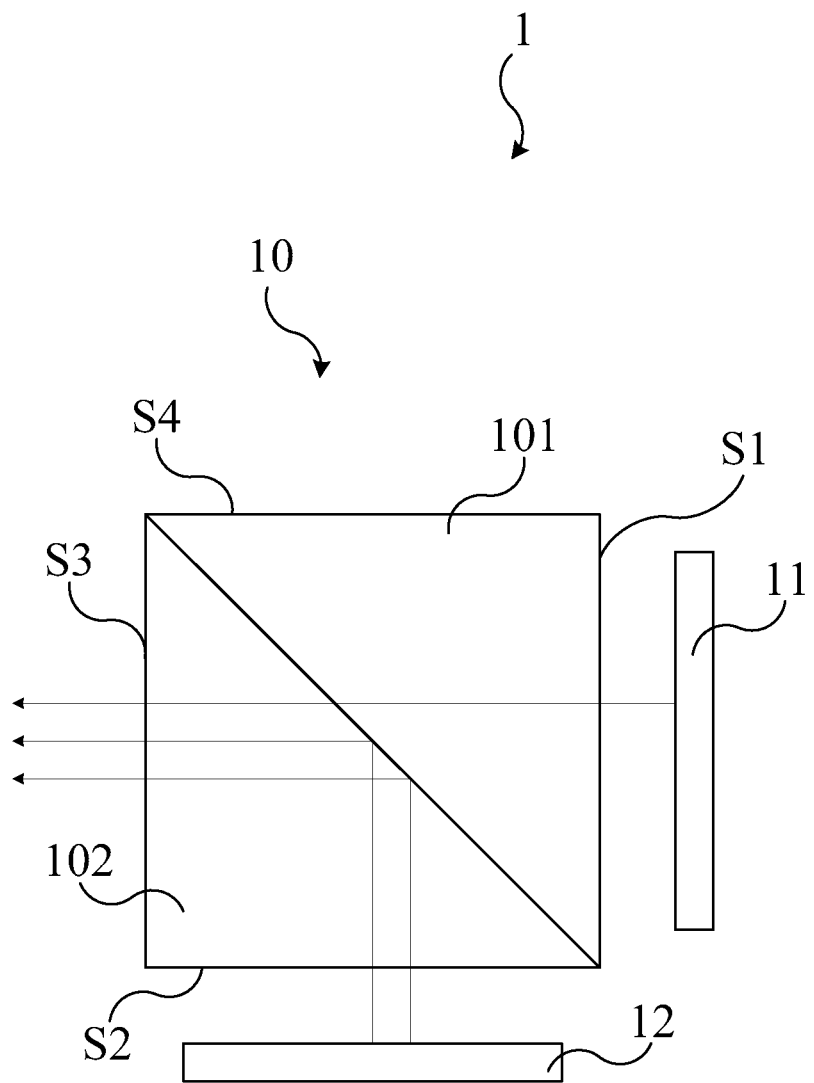
FIG. 1 is a schematic diagram illustrating an optical system according to an embodiment of the present invention.

Please refer to FIG. 1. FIG. 1 is a schematic diagram illustrating an optical system 1 according to an embodiment of the present invention. In this embodiment, the optical system 1 includes a light combination unit 10, a first LED panel 11 and a second LED panel 12. The first LED panel 11 is located at one side of the light combination unit 10, and the second LED panel 12 is located at another side of the light combination unit 10. The first LED panel 11 is configured to emit a first light into the light combination unit 10, and the second LED panel 12 is configured to emit a second light into the light combination unit 10. The light combination unit 10 is configured to combine and collimate the first light and the second light along one direction.

In practice, the optical system 1 of the present invention can be applied to optical devices. The light combination unit 10 can be a prism. The light combination unit 10 receives the first light and the second light and selectively changes the paths of the first light and the second light to collimate the lights in the same direction. The color of the first light and the second light can be selected from red, orange, yellow, green, blue, cyan and purple lights. Therefore, the light combination unit 10 combines the colors of the first light and the second light emitted from the first LED panel 11 and the second LED panel 12 to generate images.

Figure 2:
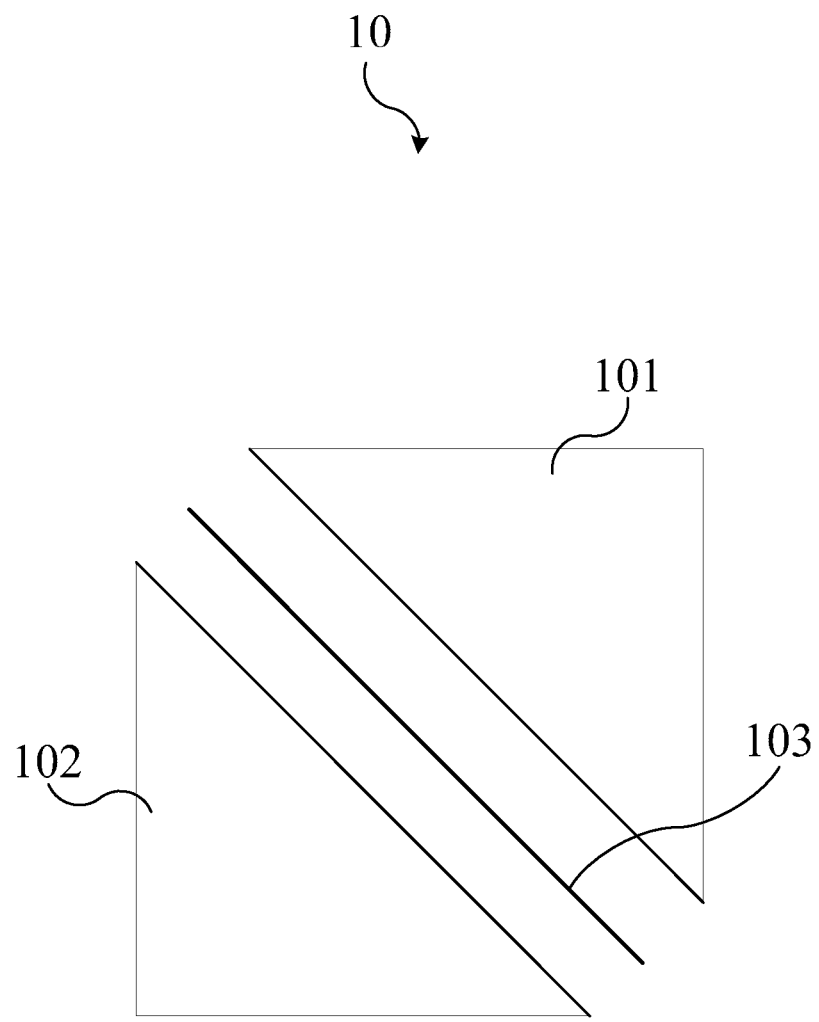
FIG. 2 is an exploded diagram illustrating the light combination unit in FIG. 1.

Please refer to FIG. 1 and FIG. 2. FIG. 2 is an exploded diagram illustrating the light combination unit 10 in FIG. 1. In this embodiment, the light combination unit 10 includes a first triangular prism 101, a second triangular prism 102 and a light filtering layer 103 to form a cuboid structure, as shown in FIG. 2. The first LED panel 11 is configured at the first side S1 of the cuboid structure, and the second LED panel 12 is configured at the second side S2 adjacent and vertical to the first side S1 of the cuboid structure. The first triangular prism 101 is assembled with the second triangular prism 102 to form the cuboid structure. Furthermore, the first triangular prism 101 includes the first side S1, and the second triangular prism 102 includes the second side S2. The light filtering layer 103 is located between the first triangular prism 101 and the second triangular prism 102. The first light and the second light emitted from the first LED panel 11 and the second LED panel 12 would pass or be reflected by the light filtering layer 103.

In practice, the shape of the light combination unit 10 can be cuboid or cube. The shapes of first triangular prism 101 and the second triangular prism 102 can be congruent triangles. The joint surface of the first triangular prism 101 and the second triangular prism 102 can be a diagonal plane of the cuboid structure. The light filtering layer 103 is formed on the diagonal plane of the cuboid structure by coating or plating. The material of the light filtering layer 103 can be at least one selected from dielectric film and metal film. The characteristics of light wave transmission light filtering layer 103, such as light wave penetration, reflection, absorption, scattering, polarization and phase changes, and so on, can be changed according to actual need. Therefore, the light combination unit 10 can collimate the first light and the second light with different directions into the same direction.

In one embodiment, the first LED panel 11 emits red light and the second LED panel 12 emits blue light and green light, wherein the red light would pass the light filtering layer 103 but the blue light and the green light would be reflected by the light filtering layer 103. When the first LED panel 11 emits red light into the first side S1 of the light combination unit 10, the red light passes through the light filtering layer 103 and then arrives the third side S3 of the light combination unit 10 straightly to pass out of the third side S3. When the second LED panel 12 emits blue light and green light into the second side S2 of the light combination unit 10, the blue light and green light are reflected by the light filtering layer 103 to change the path and then also arrive the third side S3 to pass out of the third side S3. Therefore, the light combination unit 10 can combine the red, blue and green lights to generate an image.

In another embodiment, the first LED panel 11 emits red light and the second LED panel 12 emits blue light and green light, wherein the red light would be reflected by the light filtering layer 103 but the blue light and the green light would pass though the light filtering layer 103. When the first LED panel 11 emits red light from the first side S1 of the light combination unit 10, the red light change the path at the light filtering layer 103 and pass along the vertical direction to the forth side S4 of the light combination unit 10. When the second LED panel 12 emits blue light and green light into the second side S2 of the light combination unit 10, the blue light and green light passes through the light filtering layer 103 and then also arrive the forth side S4 to pass out of the forth side S4.

Figure 3:
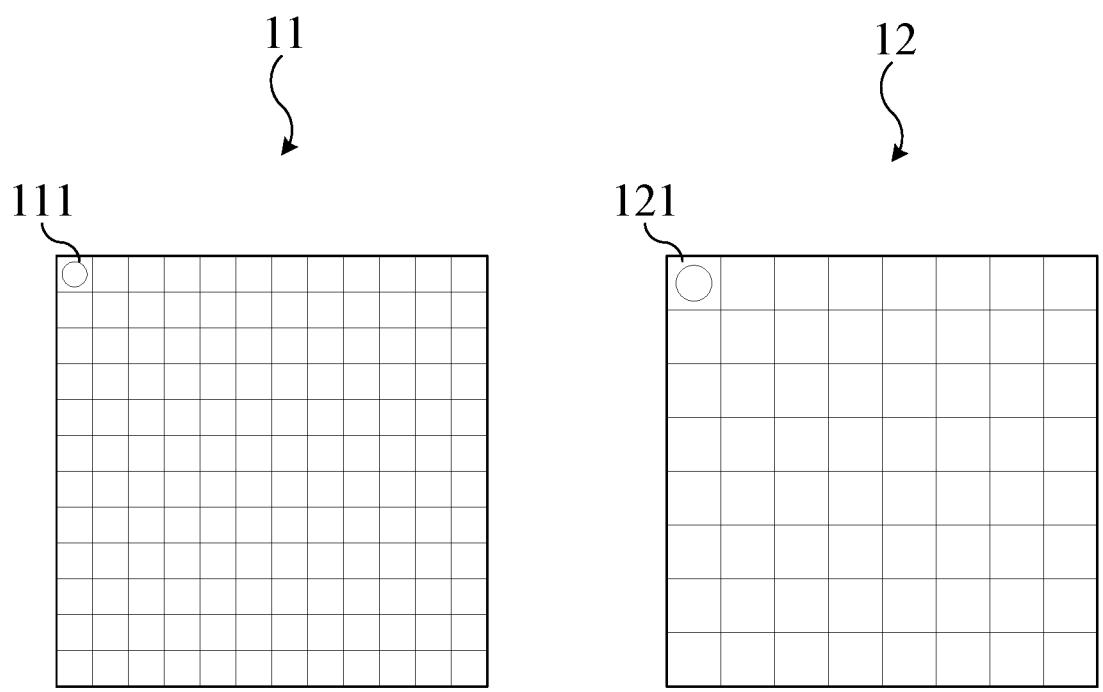
FIG. 3 is a schematic diagram illustrating the first LED panel and the second LED panel in FIG. 1.

Please refer to FIG. 1 and FIG. 3. FIG. 3 is a schematic diagram illustrating the first LED panel 11 and the second LED panel 12 in FIG. 1. In this embodiment, the first LED panel 11 includes multiple first LED pixels 111, and the second LED panel 12 includes multiple second LED pixels 121. The multiple first LED pixels are arranged in a first array, and the multiple second LED pixels are arranged in a second array. In practice, each of the pixels of the first LED panel 11 and the second LED panel 12 can emit light independently. Furthermore, the multiple first LED pixels 111 of the first LED panel 11 and the multiple second LED pixels 121 the second LED panel 12 can be controlled to emit light according to the images. The length of the pixel can be but not limited to 1 µm, 2 µm, 3 µm, 4 µm, and the size of the pixel can also be determined according to the designs or requirements.

In addition, the area of the first side S1 of the light combination unit 10 is larger than that of the first LED panel 11, and the area of the second side S2 of the light combination unit 10 is larger than that of the second LED panel 12. Furthermore, the length of the first side S1 is greater than that of the first LED panel 11, and the length of the second side S2 is greater than that of the second LED panel 12. That is to say, when the first LED panel 11 and the second LED panel 12 emit lights into the light combination unit 10, all of the multiple first LED pixels 111 and the multiple second LED pixels 121 can emit light into the light combination unit 10, thereby increasing the light emitting efficiency. In one embodiment, the length of each side of the cuboid structure is less than 10 mm, and the first LED panel 11 and the second LED panel 12 are micro LED panels. Therefore, the optical system 1 of the present invention also can be applied to miniaturized optical devices.

Figure 4:
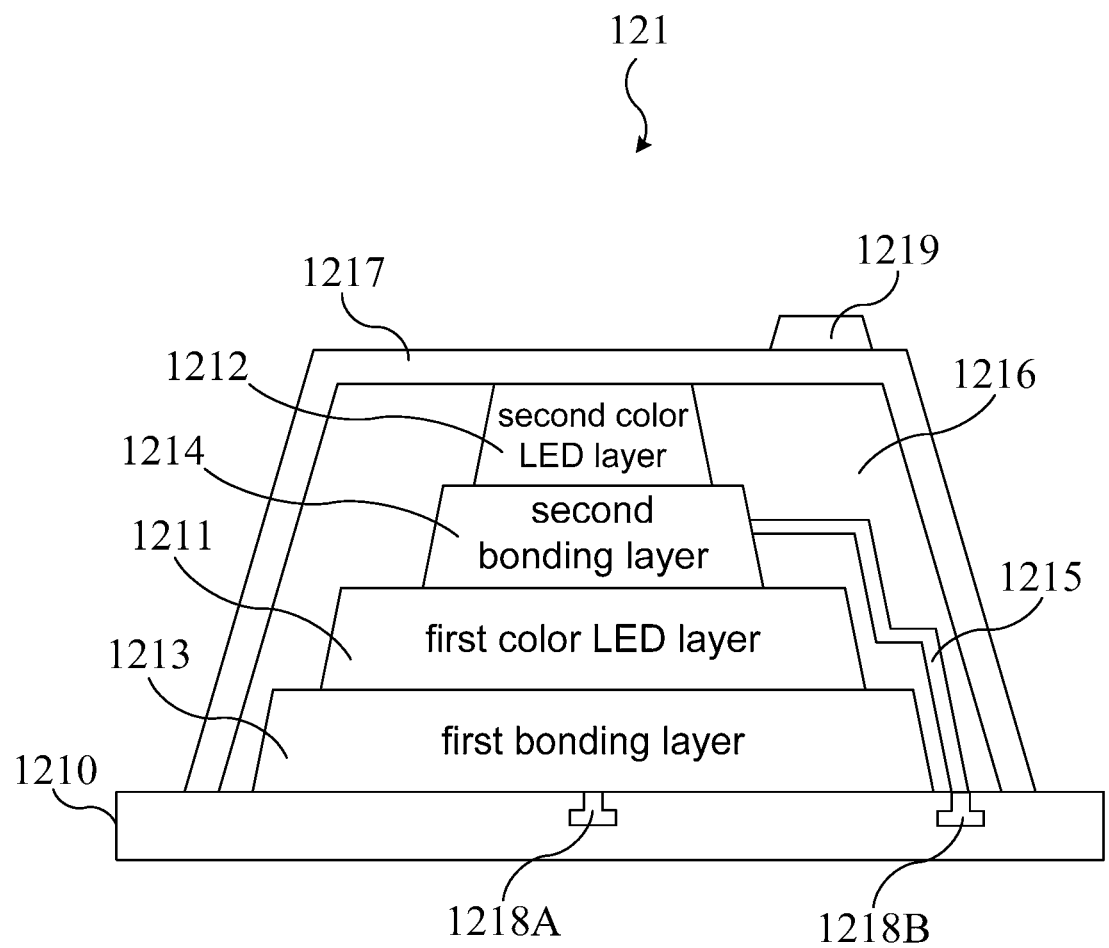
FIG. 4 is a cross-sectional diagram illustrating the second LED pixel of the second LED panel in FIG. 3.

Please refer to FIG. 3 and FIG. 4. FIG. 4 is a cross-sectional diagram illustrating the second LED pixel 121 of the second LED panel 12 in FIG. 3. In this embodiment, the first LED panel 11 is a monochrome LED panel, and the second LED panel 12 is a double color LED panel. Each of the first LED pixels 111 of the first LED panel 11 emits the first light, and each of the second LED pixels 121 of the second LED panel 12 can emit the second light with a first color and a second color at the same time.

As shown in FIG. 4, the second LED pixel 121 includes a substrate 1210, a first bonding layer 1213, a first color LED layer 1211, a second bonding layer 1214 and a second color LED layer 1212. The first bonding layer 1213 is disposed on the substrate 1210. The first color LED layer 1211 is disposed on the first bonding layer 1213. The second bonding layer 1214 is disposed on the first color LED layer 1211. The second color LED layer 1212 is disposed on the second bonding layer 1214. The first color LED layer 1211 emits a first color light, and the second color LED layer 1212 emits a second color light.

Furthermore, the cross-sectional area of the first bonding layer 1213, the first color LED layer 1211, the second bonding layer 1214, and the second color LED layer 1212 can decrease from the first bonding layer 1213 to the second color LED layer 1212. The first bonding layer 1213, the first color LED layer 1211, the second bonding layer 1214 and the second color LED layer 1212 can be formed on the substrate 1210 by chemical vapor deposition (CVD) or vapor phase epitaxy (VPE). It should be noted that "layer" described herein is not limited to a single layer but may include a plurality of sub layers. In some embodiments, a "structure" can take the form of a "layer". The substrate 1210 can be, but not limited to, a Si substrate, a sapphire substrate, or a transparent substrate such as a glass substrate. The material of the substrate 1210 also may be one selected from the group consisting of InP, SiC and ZnO. The material of the first color LED layer 1211 and the second color LED layer 1212 can be GaN, GaP, GaAs, but it is not limited herein. The first color LED layer 1211 and the second color LED layer 1212 also can be at least one of a light emitting diode (LED), a Schottky LED, and so on. The wavelengths of the first color light emitted from the first color LED layer 1211 and the second color light emitted from the second color LED layer 1212 can be selected respectively from a range from 380 nm to 700 nm in visible color range. For example, the first color light and the second color light can be selected respectively from red, blue, yellow, green, orange, cyan and purple lights.

In another one embodiment, the first color LED layer and the second color LED layer are epitaxial layers. In practice, the first color LED layer and the second color LED layer can be epitaxial layers formed by epitaxial growth, such as chemical vapor deposition (CVD), vapor phase epitaxy (VPE), liquid phase epitaxy (LPE) or solid phase epitaxy (SPE). Moreover, the first color LED layer includes a first P type epitaxial layer and a first N type epitaxial layer, and the second color LED layer includes a second P type epitaxial layer and a second N type epitaxial layer. Therefore, the arrangement from bottom to top of the second LED pixel is the substrate, the first bonding layer, the first P type epitaxial layer, the first N type epitaxial layer, the second bonding layer, the second P type epitaxial layer and the first N type epitaxial layer. It should be noted that the positions of the first P type epitaxial layer and the first N type epitaxial layer can be exchanged, and the positions of the second P type epitaxial layer and the second N type epitaxial layer can be exchanged.

Furthermore, the first color LED layer further includes a first multiple quantum well layer (MQW) disposed between the first P type epitaxial layer and the first N type epitaxial layer, and second color LED layer further includes a second multiple quantum well layer (MQW) disposed between the second P type epitaxial layer and the second N type epitaxial layer. The first MQW layer and the second MQW layer also can be epitaxial layers by epitaxial growth, to increase the light strength of the first color light and the second color light emitted from the first color LED layer and the second color LED layer.

In another one embodiment, the second LED pixel only includes the substrate, the first color LED layer and the second color LED layer. The first color LED layer is configured on the substrate, and the second color LED layer is configured on the first color LED layer. Furthermore, the first color LED layer includes the first P type epitaxial layer and the first N type epitaxial layer, and the second color LED layer includes the second P type epitaxial layer and the second N type epitaxial layer. In practice, the first P type epitaxial layer can contact the second P type epitaxial layer, and the materials of the first P type epitaxial layer and the second P type epitaxial layer are the same. That is to say, the first color LED layer and the second color LED layer share the same P type epitaxial layer. In one embodiment, the positions of the P type epitaxial layer and the N type epitaxial layer of the first color LED layer and the second color LED layer can be exchanged, and the first color LED layer and the second color LED layer share the same N type epitaxial layer.

In this embodiment, the area of the first bonding layer 1213 is larger than that of the first color LED layer 1211, the area of the first color LED layer 1211 is larger than that of the second bonding layer 1214, and the area of the second bonding layer 1214 is larger than that of the second color LED layer 1212. In practice, the shape of the second LED pixel 121 can be a stair shape. It means that the second bonding layer 1214 only covers a portion of the first color LED layer 1211, so that the other uncovered portion of the first color LED layer 211 can emit the first color light to the outside of the second LED pixel 121 directly. Therefore, the second LED panel 121 can emit two different colors at the same time, thereby reducing the volume and saving the cost.

In this embodiment, the second LED pixel 121 further includes an insulation layer 1216. The insulation layer 1216 covers the side wall of the first bonding layer 1213, the first color LED layer 1211, the second bonding layer 1214 and the second color LED layer 1212. Moreover, the insulation layer 1216 also covers the surface of the substrate 1210. In practice, the material of the insulation layer 1216 can be dielectric thin-film materials such as SiNx and SiO2, or polymeric material such as polyamide (PA). Furthermore, the insulation layer 1216 may be transparent. The insulation layer 1216 can be formed on the second LED pixel 121 by pasting, coating or CVD. Therefore, the insulation layer 1216 prevents the first bonding layer 1213, the first color LED layer 1211, the second bonding layer 1214 and the second color LED layer 1212 from causing a short circuit.

In this embodiment, the second LED pixel 121 further includes a top conductive layer 1217. The top conductive layer 1217 is configured on the insulation layer 1216 and electrically connected to the top of the second color LED layer 1212. In practice, the material of the top conductive layer 1217 can be Indium Tin Oxide (ITO), and the top conductive layer 1217 can be formed on the insulation layer 1216 commonly by vapor deposition. Furthermore, the top conductive layer 1217 may be transparent. The top conductive layer 1217 is configured to maintain a good conductivity for electrode connection. In this embodiment, the insulation layer 1216 covers the side wall of the second color LED layer 1212, and the top side of the second color LED layer 1212 is exposed. Similarly, each of the first LED pixels of the first LED panel also includes the insulation layer and the top conductive layer with same functions and configurations.

In this embodiment, the first bonding layer 1213 and the second bonding layer 1214 are metal layers. In practice, the material of the first bonding layer 1213 and the second bonding layer 1214 can include at least one selected from Au, Sn, In, Ti and Cu. Moreover, the second LED pixel 121 further includes a first anode pad 1218A and a second anode pad 1218B configured on the substrate 1210. The first anode pad 1218A is electrically connected to the first bonding layer 1213, and the second anode pad 1218B is electrically connected to the second bonding layer 1214. In practice, the first bonding layer 1213 is configured on the substrate 1210, so that the first anode pad 1218A can connect to the first bonding layer 1213 directly. The first anode pad 1218A and the second canoed pad 1218B can be P-electrodes.

Furthermore, the second LED pixel 121 can include a connecting structure 1215 connected with the second anode pad 1218B and the second bonding layer 1214. The connecting structure 1215 can be a metal wire or plate to electrically connect the second bonding layer 1214 and the second anode pad 1218B. In addition, the second LED pixel 121 includes a cathode pad 1219 configured on the top conductive layer 1217, and includes a isolation layer and a conductive layer (not shown in figure) configured between the first color LED layer 1211 and the second bonding layer 1214. The cathode pad 1219 can be N-electrode or ground pad. In practice, the position of the cathode pad 1219 is not limited in the FIG. 4. In another embodiment, the top conductive layer extends between the pixels, and the cathode pad is disposed on the top conductive layer and located at the position between the pixels. Furthermore, the conductive layer is disposed on the first color LED layer and electrically connected to the top conductive layer, and the isolation layer is disposed on the conductive layer. Therefore, when the first anode pad 1218A and the second anode pad 1218B receive electricity, the first color LED layer 1211 and the second color LED layer 1212 can emit the first color light and the second color light.

Moreover, the second LED pixel 121 further includes a pixel driver (not shown in figure) configured on the substrate 1210 and electrically connected to the first anode pad 1218A and the second anode pad 1218B. In practice, the pixel driver can be a controlling chip. The pixel driver can be connected to the positive electrode of a power source, and then selectively apply the electricity to the first anode pad 1218A and the second anode pad 1218B to control the first color LED layer 1211 and the second color LED layer 1212 to emit light.

Figure 5:
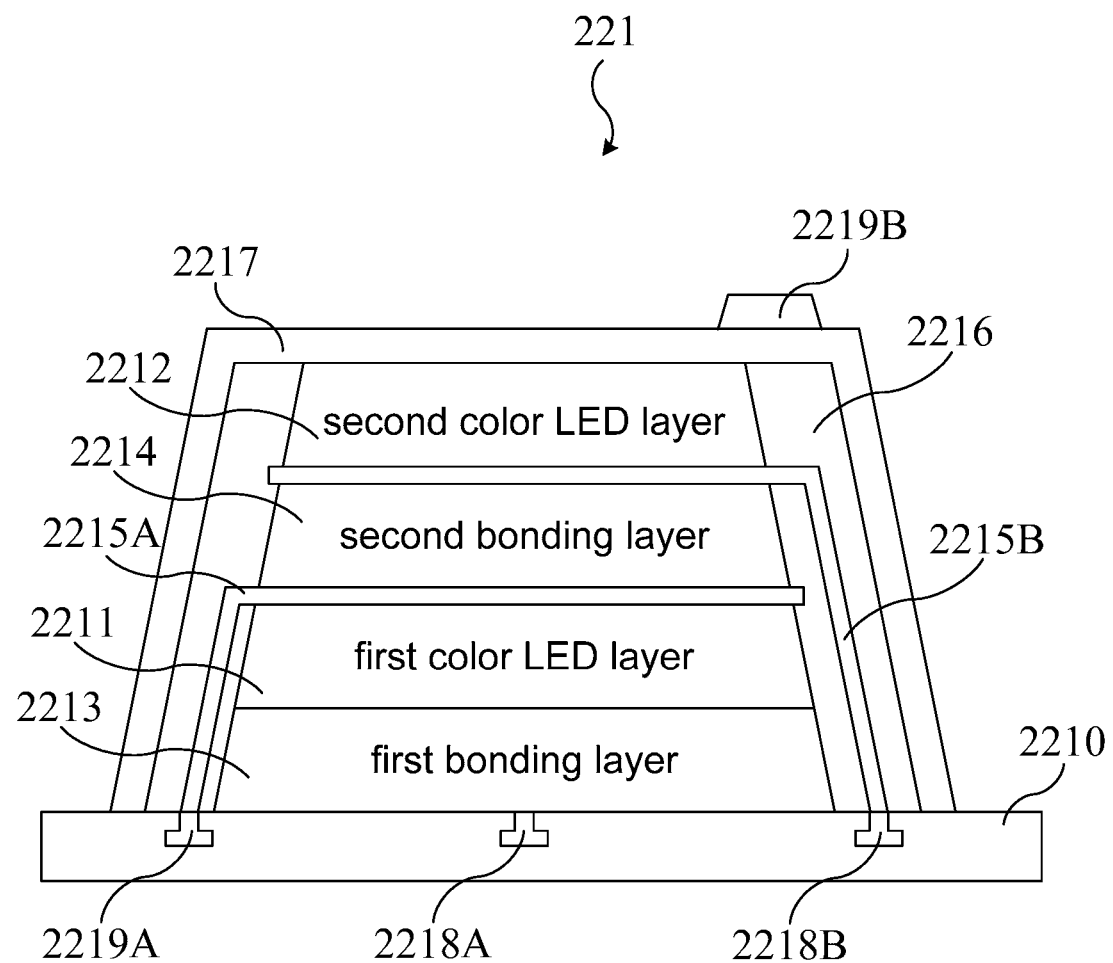
FIG. 5 is a cross-sectional diagram illustrating the second LED pixel of the second LED panel according to another embodiment of the present invention.

In the present invention, there may be another configuration for the second LED pixel. Please refer to FIG. 5. FIG. 5 is a cross-sectional diagram illustrating the second LED pixel 221 of the second LED panel according to another embodiment of the present invention. The difference between this embodiment and aforementioned embodiment is that the second bonding layer 2214 is a non-metallic layer in this embodiment. Furthermore, the second bonding layer 2214 is transparent. In practice, the material of the second bonding layer 2214 can be SiO2 or transparent plastic/resin such as spin-on glass (SOG) or bonding adhesive Micro Resist BCL-1200. The first color light emitted from the first color LED layer 2211 can pass through the second bonding layer 2214 for the second bonding layer 2214 is transparent. Furthermore, because the second color LED layer 2212 also can be transparent, the first color light emitted from the first color LED layer 2211 can pass through the second bonding layer 2214 and the second color LED layer 2212. In one embodiment, the first bonding layer and the second bonding layer are non-metallic layers, and the first bonding layer and the second bonding layer are transparent. The functions and configurations of the insulation layer 2216 and the top conductive layer 2217 are the same with those in the aforementioned embodiments, and they will not be described herein again.

In this embodiment, the second LED pixel 221 includes a first connecting structure 2215A and a second connecting structure 2215B. A part of the first connecting structure 2215A is configured between the first color LED layer 2211 and the second bonding layer 2214, and a part of the second connecting structure 2215B is configured between the second bonding layer 2214 and the second color LED layer 2212. In practice, the first connecting structure 2215A and the second connecting structure 2215B are made of conductive materials. Furthermore, the materials of the first connecting structure 1151 and the second connecting structure 1152 also may be Indium Tin Oxide (ITO).

Moreover, the second LED pixel 221 further includes a first anode pad 2218A, a second anode pad 2218B and a first cathode pad 2219A configured on the substrate 2210, and a second cathode pad 2219B configured on the top conductive layer 2217. The first anode pad 2218A is electrically connected to the first bonding layer 2213, the second anode pad 2218B is electrically connected to the second connecting structure 2215B, and the first cathode pad 2219A is electrically connected to the first connecting structure 2215A.

Therefore, when the first anode pad 2218A and the second anode pad 2218B receive electricity, the first color LED layer 2211 and the second color LED layer 2212 can emit the first color light and the second color light. Similarly, the second LED pixel 221 also can include a pixel driver to apply electricity to the first anode pad 2218A and the second anode pad 2218B, and control the first color LED layer 2211 and the second color LED layer 2212 to emit lights respectively.

Compared with the prior art, the second LED panel of the optical system can emit two colors, thus the optical system of the present invention only needs two LED panel to combine the lights to form the images, thereby reducing the volume and costs. In addition, the light combination unit of the optical system includes only two triangular prisms, so that the combined light is less affected by the gap between the two triangular prisms, thereby improving the light combining effect and reducing costs.

With the examples and explanations mentioned above, the features and spirits of the invention are hopefully well described. More importantly, the present invention is not limited to the embodiment described herein. Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An optical system, comprising:
   a light combination unit;
   a first LED panel, located at one side of the light combination unit and configured to emit a first light; and
   a second LED panel, located at another side of the light combination unit and configured to emit a second light, the second LED panel comprising a plurality of second LED pixels, and each of the second LED pixels comprising:
     a substrate;
     a first bonding layer disposed on the substrate;
     a first color LED layer disposed on the first bonding layer and emitting a first color light;
     a second bonding layer disposed on the first color LED layer; and
     a second color LED layer disposed on the second bonding layer and emitting a second color light;
   wherein, the first LED panel is a monochrome LED panel, and the second LED panel is a double color LED panel; the first LED panel and the second LED panel respectively emit the first light and the second light into the light combination unit, and the light combination unit combines and collimates the first light and the second light along one direction.

2. The system of claim 1, wherein the light combination unit has a cuboid structure, the first LED panel is located at a first side of the cuboid structure and the second LED panel is located at a second side of the cuboid structure, the first side is vertical to the second side.

3. The system of claim 2, wherein the light combination unit comprises a first triangular prism and a second triangular prism, the first triangular prism is assembled with the second triangular prism to form the cuboid structure.

4. The system of claim 3, wherein the first LED panel is located at one side of the first triangular prism, and the second LED panel is located at one side of the second triangular prism.

5. The system of claim 3, wherein the light combination unit comprises a light filtering layer located between the first triangular prism and the second triangular prism, the light combination unit selectively passes and reflects the first light and the second light according to the light filtering layer.

6. The system of claim 2, wherein the area of the first side of the cuboid structure is larger than that of the first LED panel, and the area of the second side of the cuboid structure is larger than that of the second LED panel.

7. The system of claim 2, wherein the length of the first side of the cuboid structure is greater than that of the first LED panel, and the length of the second side of the cuboid structure is greater than that of the second LED panel.

8. The system of claim 2, wherein the lengths of the first side and the second sides are less than 10 mm.

9. The system of claim 1, wherein the color of the second light emit from the second LED panel is selected from two of blue, green, red, orange, yellow, cyan and purple lights.

10. The system of claim 1, wherein the first LED panel comprises a plurality of first LED pixels and the second LED panel comprises a plurality of second LED pixels, each of the second LED pixels selectively emits the second light with a first color light and a second color light.

11. The system of claim 10, wherein the first LED pixels are arranged in a first array, and the second LED pixels are arranged in a second array.

12. The system of claim 1, wherein each of the second pixels comprises an insulation layer, the insulation layer covers the side wall of the first bonding layer, the first color LED layer, the second bonding layer, the second color LED layer, and the surface of the substrate.

13. The system of claim 12, wherein each of the second pixels comprises a top conductive layer configured on the insulation layer and electrically connected to the second color LED layer.

14. The system of claim 1, wherein the area of the first color LED layer is larger than that of the second bonding layer, and the area of the second bonding layer is larger than that of the second color LED layer.

15. The system of claim 1, wherein the first bonding layer and the second bonding layer are metal layers.

16. The system of claim 15, wherein each of the second pixels comprises a first anode pad and a second anode pad configured on the substrate, the first anode pad is electrically connected to the first bonding layer, and the second anode pad electrically connected to the second bonding layer.

17. The system of claim 1, wherein the second bonding layer is transparent, and the second bonding layer is a non-metallic layer.

18. The system of claim 17, wherein each of the second pixels comprises a first connecting structure and a second connecting structure, the first connecting structure is configured between the first color LED layer and the second bonding layer, and the second connecting structure is configured between the second bonging layer and the second color LED layer.

19. The system of claim 18, wherein each of the second pixels comprises a first anode pad, a second anode pad and a cathode pad configured on the substrate, the first anode pad electrically connected to the first bonding layer, the second anode pad electrically connected to the second connecting structure, and the cathode pad electrically connected to the first connecting structure.

* * * * *